(12) United States Patent
Ishikawa et al.

(10) Patent No.: US 6,836,021 B2
(45) Date of Patent: Dec. 28, 2004

(54) SEMICONDUCTOR DEVICE

(75) Inventors: Toshikazu Ishikawa, Kodaira (JP); Takahiro Naito, Kodaira (JP); Hiroshi Kuroda, Akishima (JP); Yoshinari Hayashi, Higashimurayama (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/698,410

(22) Filed: Nov. 3, 2003

(65) Prior Publication Data

US 2004/0178502 A1 Sep. 16, 2004

(30) Foreign Application Priority Data

Mar. 12, 2003 (JP) ........................................ 2003-065891

(51) Int. Cl.$^7$ .............................................. H01L 23/48
(52) U.S. Cl. ........................ 257/777; 257/723; 257/737
(58) Field of Search ................................ 257/777, 723, 257/737

(56) References Cited

U.S. PATENT DOCUMENTS 6,740,980 B2 * 5/2004 Hirose ........................ 257/777

FOREIGN PATENT DOCUMENTS

WO    WO 02/103793    12/2002

\* cited by examiner

Primary Examiner—David Nelms
Assistant Examiner—Tu-Tu Ho
(74) Attorney, Agent, or Firm—Miles & Stockbridge P.C.

(57) ABSTRACT

A reduction in a size of a multichip module having a plurality of chips (higher-density mounting) and improvements in the reliability and functionality thereof are intended. By alternately repeating stacking in layers and processing of insulating films and conductive films, a microcomputer chip is face-down bonded to an upper portion of a wiring substrate having build-up substrate portions formed with wires with a surface of the microcomputer chip formed with a bump electrode facing downward. Memory chips are bonded onto an upper portion of the microcomputer chip with the respective surfaces thereof formed with bonding pads and the like facing upward. The bonding pads and the like are connected to bonding pads along edges of the wiring substrate with conductive wires. By thus disposing the microcomputer chip having multifunctionality and a larger number of terminals in a lower layer, the size reduction of a device and the like can be achieved.

20 Claims, 14 Drawing Sheets

3.949
2B
PB
PB
PB
PB
7.428
PB
PB
PB
PB
70pin

2B

SEMICONDUCTOR DEVICE

BACKGROUND OF THE INVENTION

The present invention relates to a semiconductor device and, more particularly, to a technology which is effective when applied to a multichip module (MCM) in which a plurality of semiconductor chips are mounted on a single wiring substrate or to a multichip package (MCP).

For the achievement of an improved mounting density in a semiconductor device, various multilayer packages have been proposed in which a plurality of semiconductor chips are mounted in three dimensions on a wiring substrate.

In an exemplary case, memory chips and a microcomputer chip are mounted on a wiring substrate to construct a system. Such a package is also termed as a system in package (SiP).

Memory chips include a DRAM (Dynamic Random Access Memory) and a nonvolatile memory (flash memory), which are encapsulated in conjunction with a high-speed microprocessor (MPU: Micro Processing Unit, very-small-size arithmetic processor) in a single resin package. Such an SiP is higher in functionality than a memory module obtained by resin encapsulating a memory chip so that it is in greater demand.

In particular, mobile equipment for communication such as a mobile phone requires a semiconductor device which is multifunctional and smaller in size so that the SiP is suitable for use in such equipment.

For example, Patent Document 1 discloses a semiconductor device in which a chip (2C) formed with a high-speed microprocessor is formed above two chips, which are the chip (2A) formed with a DRAM and the chip (2B) formed with a flash memory.

[Patent Document 1] International Publication No. WO 02/103793 A1 (FIG. 2)

SUMMARY OF THE INVENTION

The present inventors have developed a multichip module (MCM) in which a plurality of semiconductor chips (hereinafter simply referred to as chips) are embedded in a single package.

The present inventors have examined a multichip module in which a chip formed with a DRAM, a chip formed with a flash memory, and a chip formed with a high-speed microprocessor (MPU) are encapsulated in a single resin package.

In mounting the foregoing three chips on a wiring substrate, the resulting MCM is increased disadvantageously in size if all the chips are mounted in juxtaposed relation so that the present inventors have examined an MCM in which the three chips are mounted in a multilayer structure.

However, there may be a case where the MCM is unintentionally increased in size if a chip formed with a high-speed microprocessor having a large number of pins because of its multifunctionality is disposed in an upper layer as disclosed in Patent Document 1 mentioned above. This is because a sufficiently large wire-to-wire spacing (spacing between bonding pads on a wiring substrate) should be provided when an upper-layer chip and the wiring substrate are connected to each other by wire bonding.

Thus, in the case of stacking a plurality of chips in layers, it is not only important to perform placement by considering the sizes of the chips positioned at the upper and lower levels but also necessary to assemble the chips into a finished MCM which is small in size by considering the characteristics of the individual chips (including pin count and pin arrangement).

In a structure in which an upper-level chip protrudes from (overhangs) the end portion of a lower-level chip, a mold resin is less likely to be filled in the portion underlying the overhanging portion so that an air pool (void) is likely to be formed. If the thermal expansion of the air in the void is repeated during a heat load test, e.g., the delamination between a mold resin and the chip or the cracking of the mold resin (package crack) occurs.

It is therefore an object of the present invention to provide a multichip module having a plurality of chips which is smaller in size or higher in mounting density.

Another object of the present invention is to provide a multichip module having a plurality of chips which has been improved in reliability.

Still another object of the present invention is to provide a multichip module having a plurality of chips which has been improved in functionality.

The above and other objects and novel features of the present invention will become apparent from the description of the present specification and the accompanying drawings.

A brief description will be given to the outline of the representative aspects of the present invention disclosed in the present application.

In one aspect, a semiconductor device according to the present invention comprises: (a) a wiring substrate having a first surface and a second surface opposing the first surface, first pads being formed over a first region of the first surface, while second pads being formed over a second region surrounding the first region; (b) a microcomputer chip having bump electrodes formed over a surface thereof, the microcomputer chip being mounted over the first region of the wiring substrate such that the first pads and the bump electrodes are electrically connected to each other; and (c) a memory chip having third pads formed over a surface thereof, the memory chip being mounted over a back surface of the microcomputer chip, the third pads being connected to the second pads by use of conductive wires.

In another aspect, the semiconductor device according to the present invention comprises: (a) a wiring substrate having a first surface and a second surface opposing the first surface, first pads being formed over a first region of the first surface, while second pads being formed over a second region surrounding the first region; (b) a microcomputer chip having bump electrodes formed over a surface thereof, the microcomputer chip being mounted over the first region of the wiring substrate such that the first pads and the bump electrodes are electrically connected to each other; and (c) first and second memory chips mounted over a back surface of the microcomputer chip, (c1) the first memory chip having third pads formed over a surface thereof, (c2) the second memory chip having fourth pads formed over a surface thereof, (c3) the third and second pads being connected to the second pads by use of conductive wires.

In still another aspect, the semiconductor device according to the present invention comprises: (a) a wiring substrate having a first surface and a second surface opposing the first surface, first pads being formed over a first region of the first surface, while second pads being formed over a second region surrounding the first region; (b) a microcomputer chip having bump electrodes formed over a surface thereof, the microcomputer chip being mounted over the first region of the wiring substrate such that the first pads and the bump electrodes are electrically connected to each other; and (c) a plurality of memory chips mounted over a back surface of the microcomputer chip, each of the memory chips having third pads formed over a surface thereof, the third pads being connected to the second pads by use of conductive wires.

DESCRIPTION OF THE PREFERRED EMBODIMENTS

Figure 1:
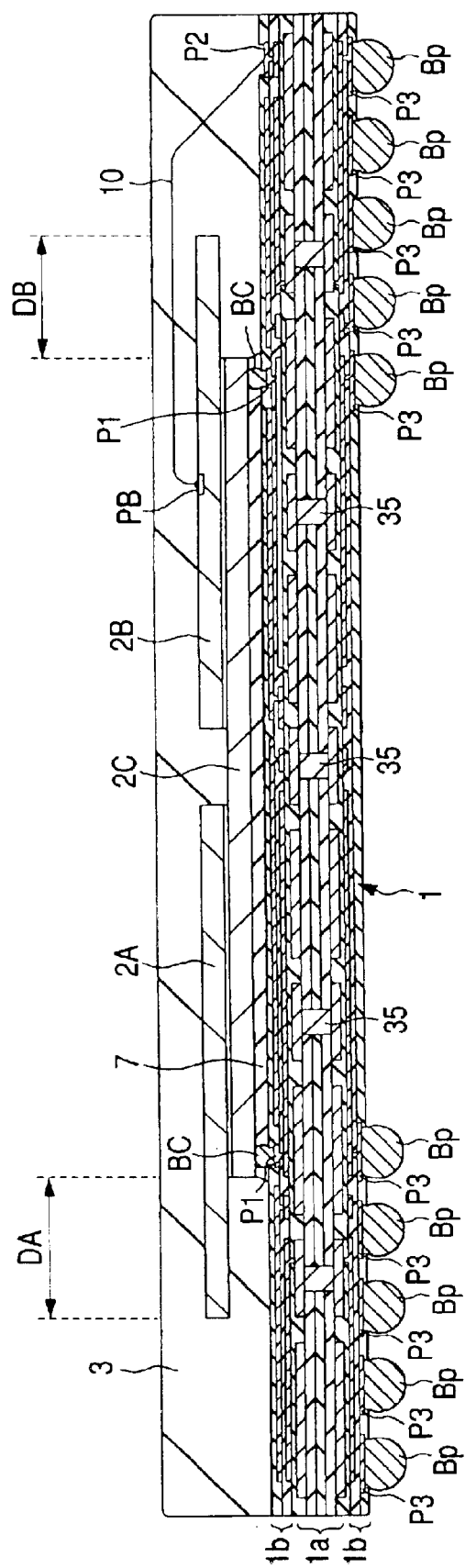
FIG. 1 is a cross-sectional view showing the principal portion of a semiconductor device according to an embodiment of the present invention.

Referring to the drawings, the embodiments of the present invention will be described in detail. In the drawings for illustrating the embodiments, identical parts are designated by identical reference numerals throughout and the repeated description thereof will be omitted. In the drawings, the depiction of some of the parts thereof, such as the number of pads, may be omitted. For convenience in illustration, dimensions such as a length-to-width ratio may be omitted if necessary in some of the drawings.

Figure 2:
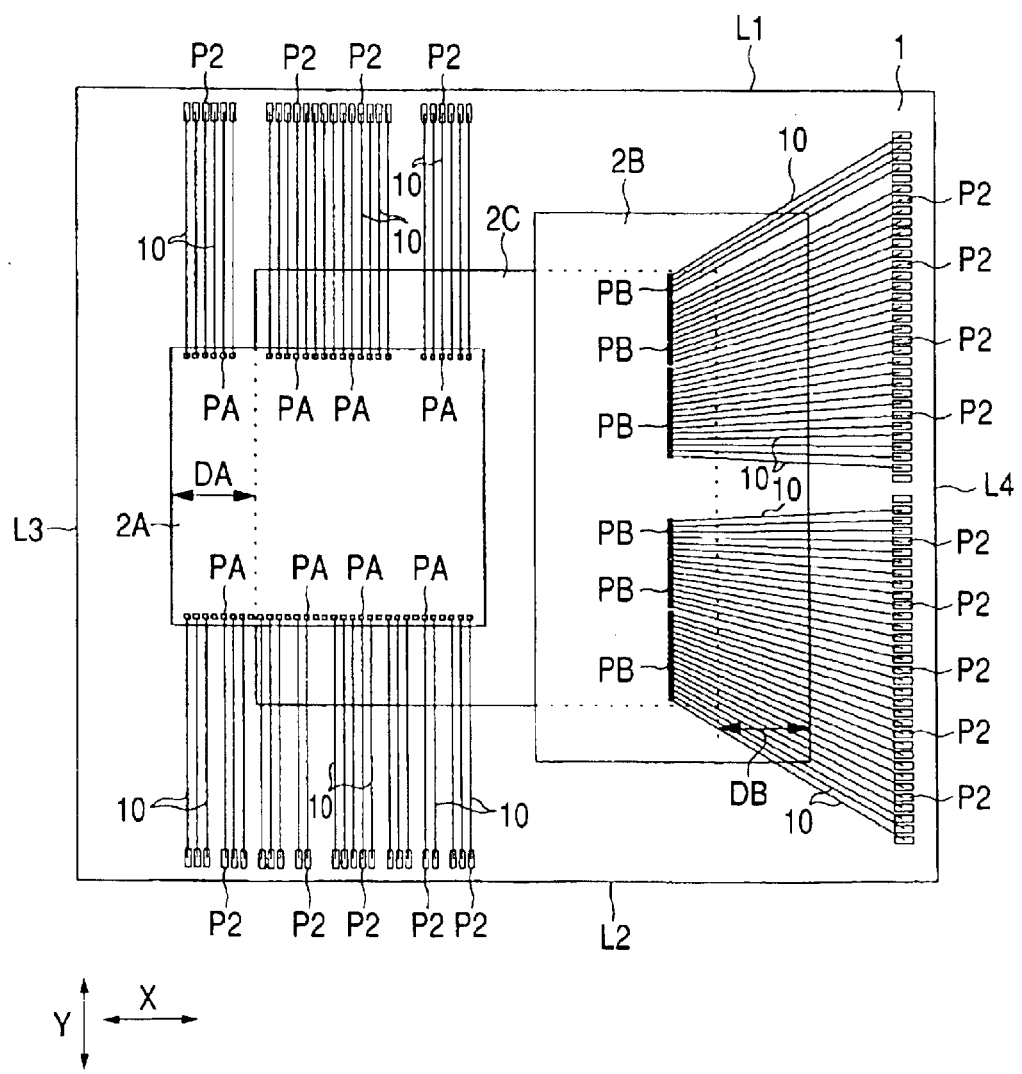
FIG. 2 is a plan view showing the upper surface of the semiconductor device according to the embodiment.
Figure 3:
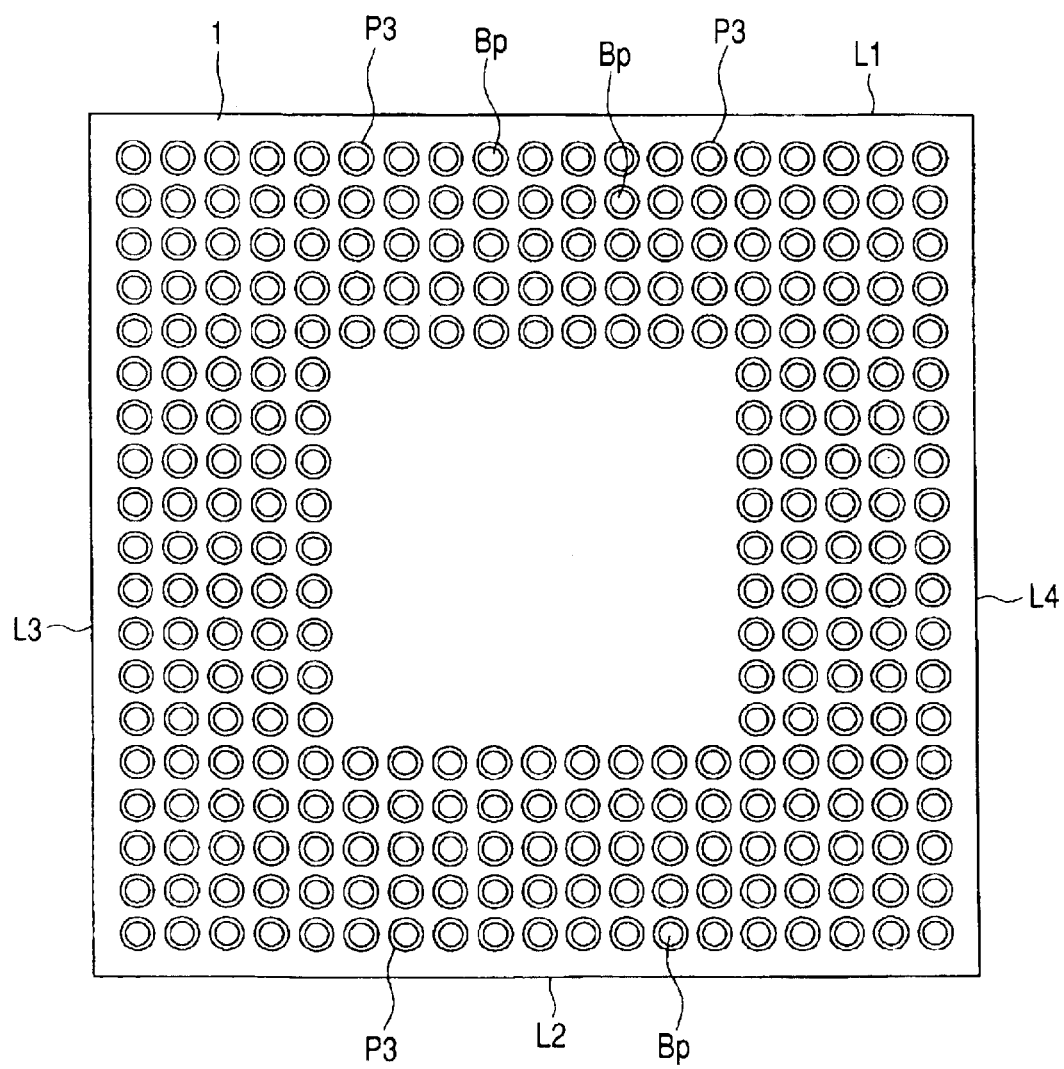
FIG. 3 is a plan view showing the lower surface of the semiconductor device according to the embodiment.

FIG. 1 is a cross-sectional view showing the principal portion of a semiconductor device according to the present embodiment. FIG. 2 is a plan view showing the upper surface of the semiconductor device. FIG. 3 is a plan view showing the lower surface of the semiconductor device.

As shown in FIGS. 1 to 3, the semiconductor device according to the present embodiment has three semiconductor chips (memory chips 2A and 2B and a microcomputer chip 2C) mounted on the principal surface of a wiring substrate (mounting substrate or package substrate) 1. The semiconductor chips (hereinafter simply referred to as chips) are encapsulated with a mold resin 3 from therearound. In the plan view of FIG. 2, the depiction of the mold resin 3 is omitted.

Such a semiconductor device in which a plurality of chips are mounted on a single wiring substrate is termed a multichip module (MCM) and an MCM having a structure in which chips are stacked in layers is termed a stacked MCM. A semiconductor device in which a memory chip and a microcomputer chip for controlling the memory chip are mounted on a single wiring substrate, such as the semiconductor device according to the present embodiment, is termed a system in package (SiP).

Figure 4:
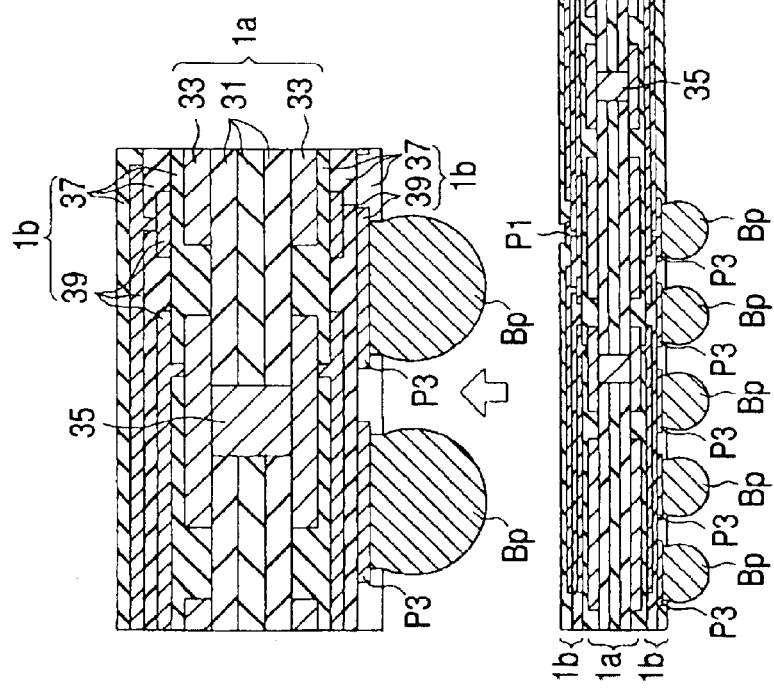
FIG. 4 is a cross-sectional view of the principal portion of a wiring substrate used for a semiconductor device according to the present invention.
Figure 5:
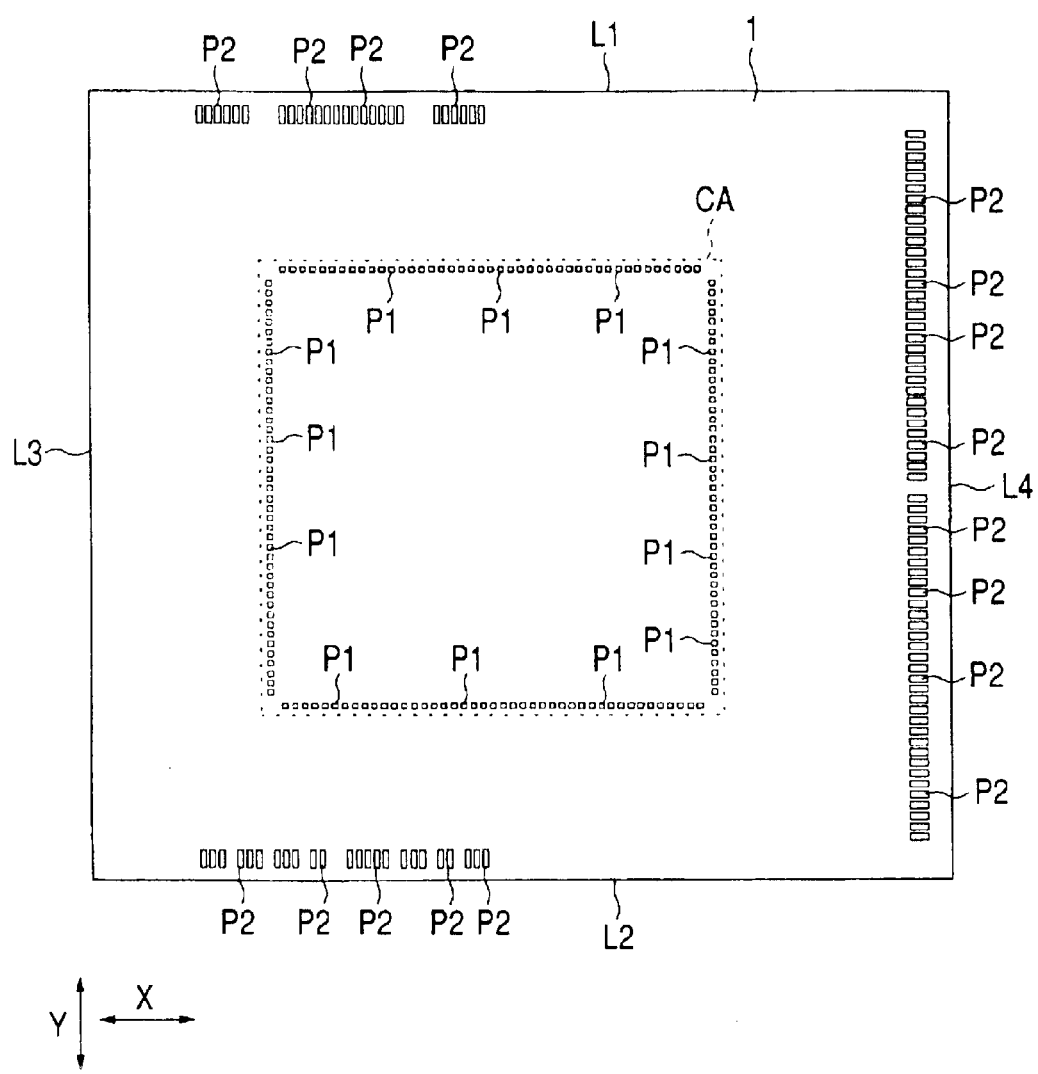
FIG. 5 is a plan view showing the upper surface of the wiring substrate used for the semiconductor device according to the present invention.
Figure 6:
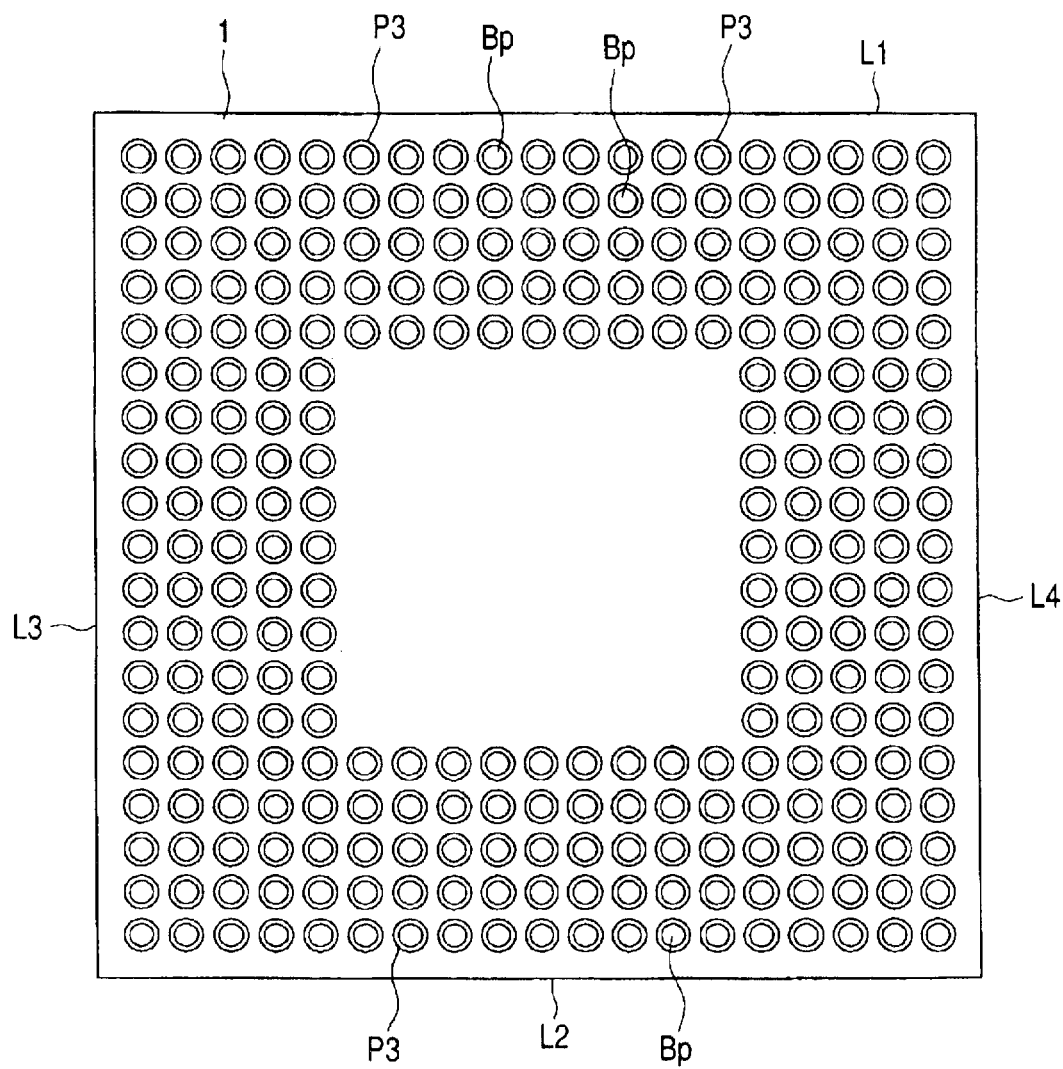
FIG. 6 is a plan view showing the lower surface of the wiring substrate used for the semiconductor device according to the present invention.
Figure 7:
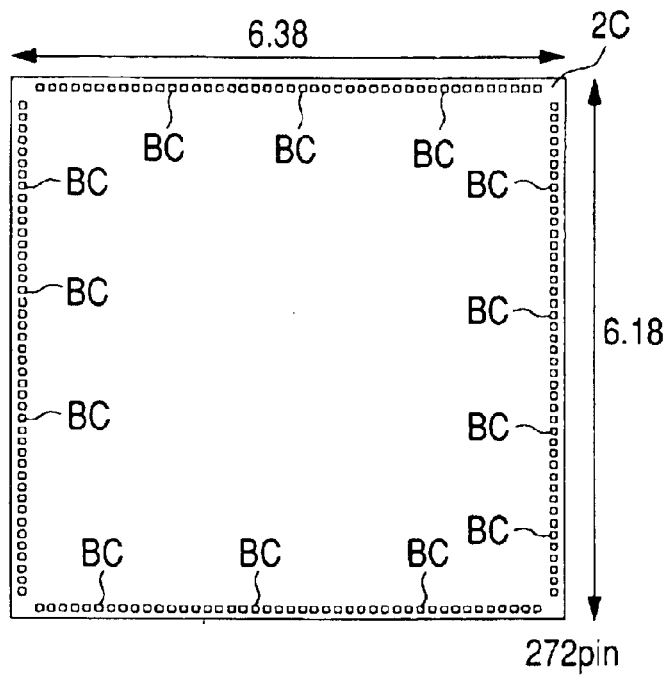
FIG. 7 is a plan view showing the upper surface of a microcomputer chip used in the semiconductor device according to the present invention.
Figure 8:
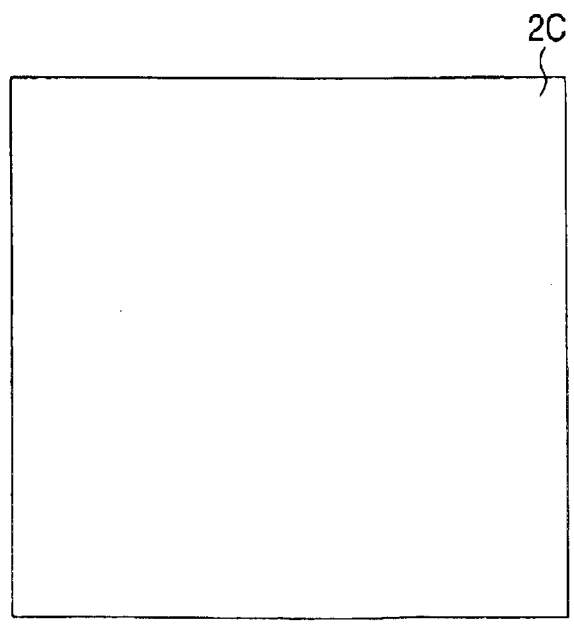
FIG. 8 is a plan view showing the lower surface of the microcomputer chip used in the semiconductor device according to the present invention.
Figure 9:
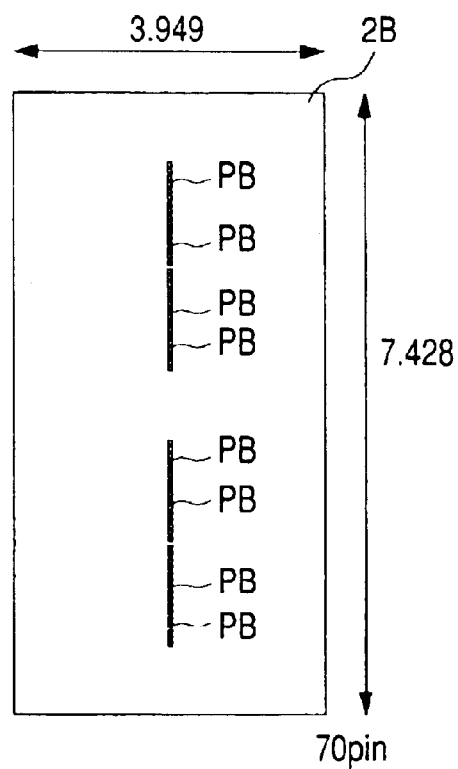
FIG. 9 is a plan view showing the upper surface of a memory chip used in the semiconductor device according to the present invention.
Figure 10:
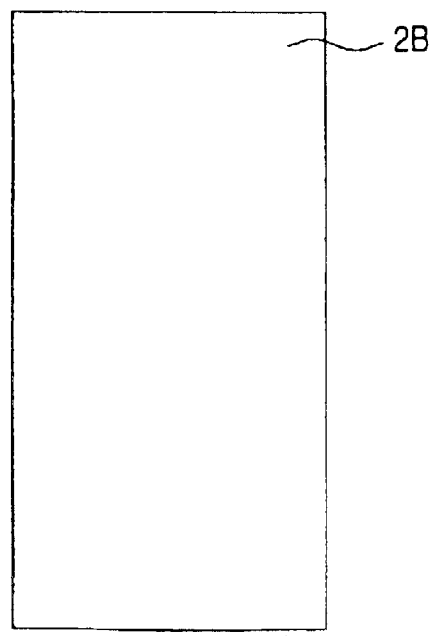
FIG. 10 is a plan view showing the lower surface of the memory chip used in the semiconductor device according to the present invention.
Figure 11:
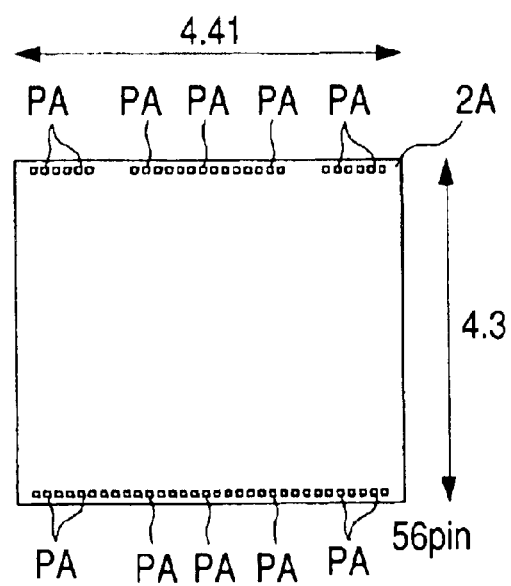
FIG. 11 is a plan view showing the upper surface of a memory chip used in the semiconductor device according to the present invention.
Figure 12:
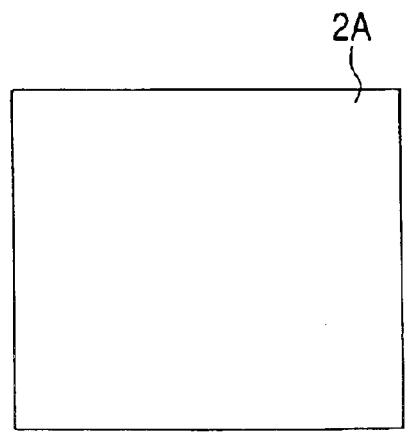
FIG. 12 is a plan view showing the lower surface of the memory chip used in the semiconductor device according to the present invention.

A description will be given next to the respective structures of the wiring substrate 1, the microcomputer chip 2C, and the memory chips 2B and 2A. FIGS. 4 to 6 are a cross-sectional view and plan views showing the principal portions and upper and lower surfaces of the wiring substrate 1, respectively. FIGS. 7 and 8 are plan views showing the upper and lower surfaces of the microcomputer chip 2C. FIGS. 9 and 10 are plan views showing the upper and lower surfaces of the memory chip 2B. FIGS. 11 and 12 are plan views showing the upper and lower surfaces of the memory chip 2A.

As shown in FIGS. 4 to 6, the wiring substrate 1 has a generally rectangular outer configuration of, e.g., 11 mm×9 mm and a thickness of about 650 $\mu$m (including the height of a bump electrode Bp which is about 250 $\mu$m). The wiring substrate 1 has a base substrate portion (core portion) 1a and build-up substrate portions 1b positioned over and under the base substrate portion 1a. The upper drawing in FIG. 4 is a partially enlarged view of the wiring substrate 1.

The base substrate portion 1a has a structure obtained by stacking a plurality of so-called printed substrates 31 each having a wire on the top or back surface thereof formed by a printing or like method. The individual wires on the plurality of printed substrates 31 are connected appropriately by base vias 35. The base vias are formed in through holes formed by a drilling process or the like. In FIG. 4, wires 33 on the uppermost and lowermost printed substrates 31 are shown, while the depiction of the wire on the middle-layer printed substrate 31 is omitted.

The build-up substrate portion 1b is formed by alternately stacking insulating films and conductive films on each of the upper and lower portions of the base substrate-portion 1a. For example, a polyimide resin film 37 is formed as an insulating film over the upper portion of the base substrate portion 1a and vias (connection holes) are formed in the polyimide resin film 37 over the wire 33 on the base substrate portion 1a by use of, e.g., a photolithographic technique. The vias may also be formed by use of a laser. As a conductive film, a copper film, e.g., is formed by a plating or like method over the upper portion of the polyimide resin film 37 including the inside of each of the vias. Thereafter, the copper film is processed to form wires 39. The wires 39 may also be formed by preliminarily forming trenches for the wires and forming a copper film in each of the trenches by a plating or like method.

By thus repeating the formation of the polyimide resin films 37, the vias, and the wires 39, the build-up substrate portions 1b are formed. Such a method for forming wires allows the formation of vias smaller than the base vias formed in the base substrate portion 1a or the wires formed thereon and the formation of wires (pads) with a fine pitch. For example, the build-up substrate portions 1b have wires with 30/30 µm lines and spaces (the minimum width of the wire is 30 µm and the minimum width of the wire-to-wire spacing is 30 µm). By contrast, the base substrate portion 1a has 60/80 µm lines and spaces (the minimum width of the wire is 60 µm and the minimum width of the wire-to-wire spacing is 80 µm). Thus, the build-up substrate portion 1b is characterized in that the minimum feature size thereof is smaller than that of the base substrate portion 1a. The upper portion of the uppermost-layer wire except for pads (pad electrodes, terminals, and pins) P1 and bonding pads (terminals and pins) P2 is covered with an insulating film such as the polyimide resin film 37 or the like. For example, the minimum pitch of the pads P1 is 65 µm and the minimum pitch of the pads P2 is 135 µm.

By contrast, the wire on the base substrate portion 1a has a minimum width of about 60 µm.

By thus using the build-up wires, extremely small wires (pads) can be formed and a chip with a pad pitch of 65 µm or less can be mounted.

By forming a wiring layer also on the lower portion of the base substrate portion 1a, the warping or distortion of the wiring substrate can be reduced. For example, the pitch of pads P3 (bump electrodes Bp) is 500 µm and the pin count thereof is 280 (see FIG. 6). The bump electrodes Bp (terminals and pins) are composed of a conductive member such as a solder and have a height of about 250 µm.

Such a substrate having wires formed by alternately repeating the stacking and processing of insulating films and conductive films is termed a build-up substrate.

As shown in FIG. 5, the upper surface (first surface) of the wiring substrate 1 is formed with the pads P1 and the bonding pads P2.

The pads P1 are arranged in a generally rectangular region (first region) CA at the center portion of the upper surface of the wiring substrate 1 along each of the edges thereof. The number (terminal count or pin count) of the pads P1 is about 272 and the pitch thereof is, e.g., about 65 µm. The microcomputer chip 2C, which will be described later, is mounted on the generally rectangular region CA.

The bonding pads P2 are arranged on the outer peripheral portion (second region outside the region CA) of the wiring board 1. The bonding pads P2 are formed along the edges (L1 and L2) of the wiring board 1 extending in the X direction and also arranged along the edge (L4) thereof extending in the Y direction. The number of the bonding pads P2 arranged along each of the edges L1 and L2 is about 56 and the minimum pitch thereof is about 135 µm. On the other hand, the number of the bonding pads P2 arranged along the edge L4 is about 70 and the minimum pitch thereof is about 135 µm.

The pads P1 and the bonding pads P2 are connected to the bump electrodes Bp (pads P3) via the wires 39 and 33, the base vias 35, and the like.

As shown in FIG. 6, the bump electrodes Bp (pads P3) are arranged in an array on the back surface (second surface) of the wiring board 1. The number of the bump electrodes Bp is about 280 and the pitch thereof is about 500 µm. In short, the bump electrodes Bp on the wiring substrate 1 has a 280-pin BGA (Ball Grid Array) structure.

The three chips (2A, 2B, and 2C) are mounted on the wiring substrate 1 which composes a junction substrate (interposer) in mounting these chips on the mother board or the like of various mobile equipment. In other words, the chips are mounted on the mother board (not shown) of various mobile equipment via the bump electrodes Bp of the wiring substrate 1.

The microcomputer chip 2C has a plurality of semiconductor elements (not shown) formed on, e.g., a silicon substrate (semiconductor substrate) and is formed by, e.g., dicing the silicon substrate in the form of a wafer. As shown in FIG. 7, the microcomputer chip 2C has a generally rectangular outer configuration of, e.g., 6.38 mm×6.18 mm and a thickness of about 0.14 mm.

Pads (not shown) are formed on the upper surface (surface or surface formed with elements) and bump electrodes BC electrically connected to the pads are formed thereon. The pads are the exposed portions of the uppermost-layer wire. The region other than the pads (bump electrode BC) is covered with an insulating film.

The bump electrodes BC are arranged along each of the edges of the generally rectangular chip 2C. The number of the bump electrodes BC is about 272. The pitch thereof is, e.g., about 65 µm. The bump electrodes BC are composed of Au (gold) or the like and can be formed by a ball bonding or like method.

As shown in FIG. 8, the silicon substrate is exposed from the lower surface (back surface) of the microcomputer chip 2C.

The microcomputer chip 2C is face-down bonded to the upper surface of the wiring substrate 1 with the surface of the microcomputer chip 2C formed with the bump electrodes BC facing downward. Specifically, the bump electrodes BC and the pads P1 on the wiring board 1 are aligned with each other and electrical connections are provided therebetween (flip-chip connections). An underfill resin 7 is filled in the gap between the surface of the microcomputer chip 2C formed with the bump electrodes BC and the wiring substrate 1. The bump electrodes BC have a height (thickness of the underfill resin 7) of, e.g., about 30 µm (see FIG. 1).

The microcomputer chip 2C is internally provided with a high-speed microprocessor (MPU) at an operating frequency of, e.g., 133 MHz. The microcomputer chip 2C controls the memory chips (2A and 2B). The relationship therebetween will be described later.

The memory chip 2B has, e.g., a DRAM memory cell formed on, e.g., a silicon substrate (semiconductor substrate). The DRAM memory cell is composed of a MISFET (Metal Insulator Semiconductor Field Effect Transistor) for data transfer and a capacitor for data storage connected in series to the MISFET for data transfer. Besides the memory cell, a peripheral circuit for driving the memory cell is also formed on the silicon substrate. The DRAM has a capacity of, e.g., 64 megabits (Mbit).

The chip is formed by, e.g., dicing the silicon substrate in the form of a wafer. As shown in FIG. 9, the chip has a generally rectangular outer configuration of, e.g., 3.949 mm×7.428 mm and a thickness of about 0.13 mm. The chip 2B is thinner than the microcomputer chip 2C.

Bonding pads PB are formed on the upper surface (surface or surface formed with elements). The bonding pads PB are the exposed portions of the uppermost-layer wire. The region other than the bonding pads PB is covered with an insulating film. The bonding pads PB are arranged in a linear configuration at the center portion of the memory chip 2B. The minimum pitch is, e.g., about 80 $\mu$m and the number thereof is, e.g., about 70.

As shown in FIG. 10, the silicon substrate is exposed at the lower surface (back surface) of the memory chip 2B.

The memory chip 2B is bonded to the back surface (surface opposite to the surface formed with elements) of the microcomputer chip 2C with the surface formed with the bonding pads PB facing upward. The distance between the memory chip 2B and the microcomputer chip 2C is, e.g., about 20 $\mu$m (see FIG. 1).

The bonding pads PB on the memory chip 2B are connected to the bonding pads P2 along the edge L4 of the wiring substrate 1 (see FIG. 2) with the conductive wires 10. In short, the memory chip 2B is wire bonded to the bonding pads P2 on the wiring substrate 1. The position at which the memory chip 2B is placed at the time of wire bonding and the direction of wire bonding will be described later.

The memory chip 2A has a nonvolatile memory (flash memory) formed on, e.g., a silicon substrate (semiconductor substrate). The flash memory is composed of a MISFET having a charge accumulation portion and a control gate electrode. Besides the memory cell, a peripheral circuit for driving the memory cell is also formed on the silicon substrate. The flash memory has a capacity of, e.g., 32 megabits.

The chip is formed by, e.g., dicing the silicon substrate in the form of a wafer. As shown in FIG. 11, the chip has a generally rectangular outer configuration of, e.g., 4.41 mm×4.3 mm and a thickness of about 0.13 mm. The chip 2A is thinner than the microcomputer chip 2C.

Bonding pads PA are formed on the upper surface (surface or surface formed with elements) of the chip 2A. The bonding pads PA are the exposed portions of the uppermost-layer wire. The region other than the bonding pads PA is covered with an insulating film. The bonding pads PA are arranged along the two opposing edges of the memory chip 2A. The minimum pitch of the bonding pads PA is, e.g., about 133 $\mu$m and the number thereof is, e.g., about 56.

As shown in FIG. 12, the silicon substrate is exposed from the lower surface (back surface) of the memory chip 2A.

The memory chip 2A is bonded onto the back surface (surface opposite to the surface formed with elements) of the microcomputer chip 2C with the surface thereof formed with the bonding pads PA facing upward. In short, the memory chip 2A is bonded to be in the same layer as the memory chip 2B. The distance between the memory chip 2A and the microcomputer chip 2C is, e.g., about 20 $\mu$m, while the distance between the memory chips 2A and 2B is, e.g., about 600 $\mu$m (see FIG. 1).

The bonding pads PA on the memory chip 2A are connected to the bonding pads P2 along the edges L1 and L2 of the wiring substrate 1 (see FIG. 2) with the conductive wires 10. In short, the memory chip 2A is wire bonded to the bonding pads P2 on the wiring substrate 1. The position at which the memory chip 2A is placed at the time of wire bonding and the direction of wire bonding will be described later.

The upper portions and sidewalls of the memory chips 2A and 2B are encapsulated with the mold resin 3. For example, the wiring substrate 1 is sandwiched between upper and lower mold dies each having a cavity and a molten resin is filled in the cavities and cured (transfer molding method). The thickness of the mold resin 3 on the wiring substrate 1 is, e.g., about 600 $\mu$m. The MCM has a height of, e.g., about 1.25 mm (see FIG. 1).

A description will be given next to a control relationship between the microcomputer chip 2C and the memory chips (2A and 2B).

Figure 13:
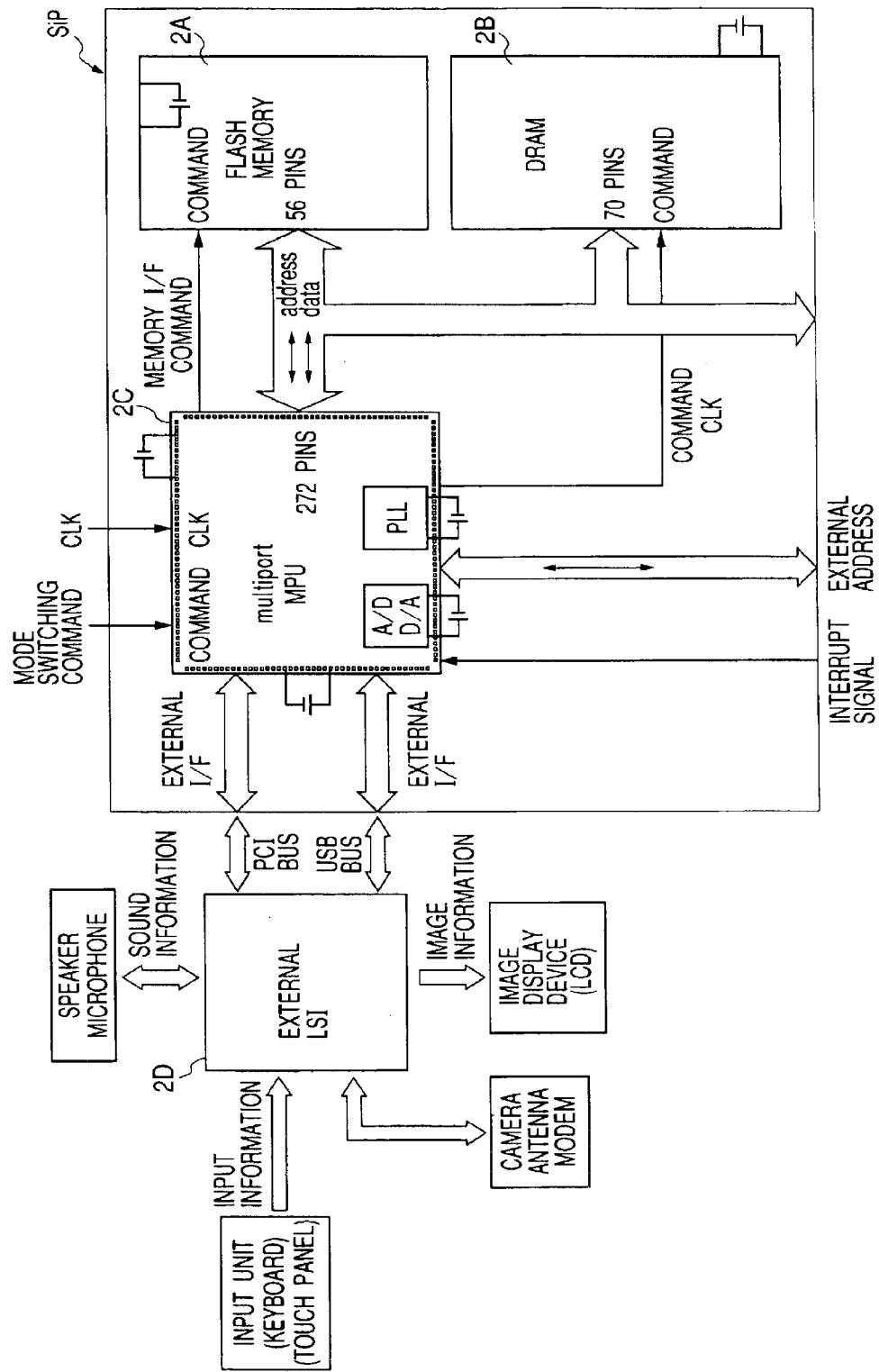
FIG. 13 is a block diagram showing a control relationship between the microcomputer chip and the memory chips used in the semiconductor device according to the present invention.

The memory chips 2A and 2B are controlled by the microcomputer chip 2C. The respective functions of the microcomputer chip 2C and the memory chips 2A and 2B and the resulting pin configuration will be described with reference to FIG. 13.

Although the description will be given to the case where the memory chip 2B formed with the DRAM and the memory chip 2A formed with the flash memory are provided as memory chips according to the present embodiment, the number and types of the memory chips are not limited to this exemplary case.

The microcomputer chip 2C performs the inputting and outputting of data between an external LSI (2D) provided outside the system and the memory chips 2A and 2B provided inside the system. For this purpose, the microcomputer chip 2C converts a logic address (external address) for an external interface to an address for the flash memory or the DRAM.

When the microcomputer chip 2C plays such a role, it requires pins for composing the external interface in addition to the pin count necessary for the interface between the microcomputer chip 2C and the memory chips 2A and 2B. Accordingly, the microcomputer chip 2C has a pin count higher than that of each of the memory chips 2A and 2B by the pin count required for the external interface.

Data outputted via the external interface is converted to various information via the external LSI (2D) and outputted to human interface equipment or network equipment which transmits data between itself and a human being. For example, sound information is outputted as a sound via a speaker and image information is outputted as an image via an image display device such as an liquid crystal display (LCD). There are also cases where information inputted from the human interface equipment or the network equipment is inputted to the external interface of the microcomputer chip 2C via the external LSI (2D). Input information includes sound information inputted via a microphone. The external LSI (2D) transmits data between itself and a camera, an antenna, a modem, or another device.

The microcomputer chip 2C according to the present embodiment has a PCI bus and a USB bus as external interfaces. In the case where the microcomputer chip 2C thus has plural types of external interfaces, the microcomputer 2C requires a pin count higher than in the case where the microcomputer 2C has only one type of external interface.

In the case where memory chips include plural types of memory chips such as the flash memory chip (2A) and the DRAM chip (2B), the memory interface of the microcomputer chip 2C requires a pin count higher than the pin count required by the interface of each of the memory chips.

When the memory chips thus include plural types of memories, there are cases where the memory interface of the microcomputer chip 2C is configured to have a pin count higher than that of each of the memory chips 2A and 2B.

There is also a case where the microcomputer chip has various circuits other than the MPU. In that case, a higher pin count is necessary to provide a stable power supply to each of the circuits. For example, the microcomputer chip 2C according to the present embodiment has an A/D converter circuit, a D/A converter circuit, and a PLL circuit. Since such an A/D converter circuit, a D/A converter circuit, and a PLL circuit may form power-supply noise sources and properties susceptible to power-supply noise from the outside, they have power supply pins disconnected from the MPU, which causes a further increase in the pin count of the microcomputer chip 2C. The microcomputer chip 2C also has the external interface circuit. To implement stable signal amplification in the external interface circuit, power supply pins independent of an internal circuit such as the MPU are necessary, which also causes an increase in the pin count of the microcomputer chip 2C.

Accordingly, the number of the bump electrodes BC on the microcomputer chip 2C is 272 (see FIG. 7), while the number of the bonding pads PB on the memory chip 2B is 70 (terminals or pins) and the number of the bonding pads PA on the memory chip 2A is about 56 so that the sum of the numbers is about 126, as described above with reference to, e.g., FIGS. 9 and 11.

Thus, the pin count of the microcomputer chip 2C which is composed of a multi-port structure comprising various interfaces with the outside of the system in addition to the interfaces inside the system (memory chips 2A and 2B and the like) is far higher than the pin counts of the memory chips 2A and 2B.

Since the plurality of chips are mounted in multiple layers according to the present embodiment, the MCM can be reduced in size or increased in density. Since the microcomputer chip is embedded in the MCM to provide the SiP, the MCM becomes multifunctional.

Since the microcomputer chip with a higher pin count because of its multifunctionality is disposed in the lower layer and flip-chip connection is provided while the memory chip with a lower pin count is disposed in the upper layer and wire bonding connection is provided, the MCM can be reduced in size.

If the microcomputer chip with a higher pin count because of its multifunctionality is disposed in the upper layer, e.g., the number of the bonding pads P2 formed on the outer peripheral portion of the wiring substrate is increased. If the microcomputer chip 2C is wire bonded to the wiring substrate 1, the bonding pads P2 should be arranged with a large pitch for the prevention of a short circuit between the wires. To prevent contact between the wires and the chip, the wires should have a sufficiently high loop height (the distance between the surface of the chip and the highest level value of the wire) and the distance between the end portion of the upper-layer chip and the bonding pad P2 should be sufficiently large. For these reasons, the wiring substrate 1 is increased disadvantageously in size when the microcomputer chip with a high pin count is disposed in the upper layer.

By contrast, the present embodiment has disposed the memory chip with a lower pin count in the upper layer so that the number of the bonding pads P2 can be reduced advantageously. In addition, the bonding pads P2 can be arranged closer to the end portion of the upper-layer chip with a smaller pitch. This achieves a reduction in the size of the wiring substrate 1, i.e., provides a smaller-size MCM. In addition, a short circuit between the wires can be prevented and the reliability of the MCM can be improved.

By forming the wiring substrate 1 as a so-called build-up substrate, the flip-chip connection for a microcomputer with a high pin count can be performed. Since the microcomputer chip with a high pin count is disposed at the lower level and flip-chip connection is provided, connection reliability can be improved.

A description will be given next to the positions at which the memory chips 2A and 2B are placed and to the direction of wire bonding.

As stated previously, the microcomputer chip 2A is flip-chip connected to the center portion of the wiring substrate 1 and the memory chips 2A and 2B are bonded to the upper portion of the microcomputer chip 2C.

As shown in FIG. 2, the bonding pads PA on the memory chip 2A are arranged along the edges L1 and L2 of the four edges of the wiring substrate 1, while the bonding pads PB on the memory chip 2B are arranged along the line L4 of the four edges of the wiring substrate 1. In other words, the directions in which the bonding pads PA and PB on the memory chips 2A and 2B are arranged are along the directions in which the edges of the microcomputer chip 2C extend.

The bonding pads PB on the memory chip 2B are extracted toward the edge L4 of the wiring substrate 1, while the bonding pads PA on the memory chip 2A are extracted toward the edge L1 or L2 of the wiring substrate 1. In other words, the bonding pads PB on the memory chip 2B are extracted in the X direction, while the bonding pads PA on the memory chip 2A are extracted in the Y direction.

It can also be said that the bonding pads PB on the memory chip 2B are wire bonded in a direction in which they do not pass over another memory chip (which is the memory chip 2A in this case) in the same layer. On the other hand, the bonding pads PA on the memory chip 2A are wire bonded in a direction in which they do not pass over another memory chip (which is the memory chip 2B in this case) in the same layer. In other words, each of the memory chips is disposed such that conductive wires providing connections between the bonding pads thereon and the wiring substrate do not extend over another memory chip.

Since the present embodiment has disposed each of the memory chips such that the conductive wires providing connections between the bonding pads thereon and the wiring substrate do not extend over another memory chip, the MCM can be reduced in size and improved in reliability.

If each of the memory chips is disposed such that the conductive wires providing connections between the bonding pads and the wiring substrate extend over another memory chip, the length of each of the wires is increased and the loop height of the wire is also increased. Accordingly, the wiring substrate is increased disadvantageously in size and the probability of a short circuit occurring between the wires or between the wire and the chip is also increased.

Each of the memory chips 2B and 2A has the end portion thereof in the X direction protruding from the end portion of the microcomputer chip 2C in the X direction (in the overhanging state), as shown in FIGS. 1 and 2. The amount of overhang DB of the memory chip 2B is, e.g., about 1.2 mm and the amount of overhang DA of the memory chip 2A is, e.g., about 1.3 mm.

As stated previously, the outer configuration of the memory chip 2B measures, e.g., 3.949 mm×7.428 mm and the outer configuration of the memory chip 2A measures, e.g., 4.41 mm×4.3 mm, while the outer configuration of the microcomputer chip 2C measure, e.g., 6.38 mm×6.18 mm.

If the memory chips 2B and 2A are arranged in the directions shown in FIG. 2, therefore, the sum of the lengths of the respective edges thereof in the X direction becomes 8.359 mm (=3.949+4.41), which is larger than 6.38 mm as the length of the edge of the microcomputer chip in the X direction.

Thus, in the present embodiment, the memory chips 2A and 2B are arranged to protrude from the edges (L3, L4) of the microcomputer chip extending in the Y direction.

Since the present embodiment has thus arranged the memory chips 2A and 2B such that they protrude from the both ends of the microcomputer chip, a portion which is extremely large in the amount of overhang (the length of the protruding portion) can be eliminated so that the delamination of the chip or the cracking of the mold resin (package crack) is prevented.

It is also possible to, e.g., arrange the memory chips 2B and 2A such that the bonding pads PB on the memory chip 2B and the bonding pads PA on the memory chip 2A do not protrude from the microcomputer chip 2C and that only the memory chip 2A protrudes from the end portion of the microcomputer chip 2C. In this case, however, the amount of overhang of the memory chip 2A is increased. In other words, a cavity under the protruding portion of the memory chip 2A is increased in size. If the cavity is large in size, a molten resin is less likely to be filled therein when the chip is encapsulated with a resin from therearound so that an air pool (void) is likely to be formed. If such a void is formed, the thermal expansion of the air in the void is repeated during, e.g., a heat load test so that the delamination of the mold resin from the chip or the cracking of the mold resin (package crack) occurs.

This is because the arrangements of the bonding pads on the principal surfaces of the memory chips vary from one memory chip to another and, e.g., the distances from the edges of the memory chips to the bonding pads also vary from one memory chip to another so that, if a higher priority is given to the placement of the bonding pads on the upper portion of the microcomputer chip, the amounts of overhang from the bonding pads to the edges of the memory chips are greatly different from one memory chip to another due to the different distances from the bonding pads to the edges of the memory chips.

By contrast, the present embodiment has arranged the chips such that the upper-layer chip protrudes from the both sides of the lower-layer chip so that the occurrence of the cracking of the chip and a package crack is reduced.

In the case where plural types of memory chips are mounted, in particular, if attention is focused on the edge portions of the memory chips protruding from the microcomputer chip, the difference between the amounts of overhang from the memory chips is adjusted to be smaller than the difference between the distances from the bonding pads to the edges of the memory chips, whereby the occurrence of the cracking of the chip or a package crack due to the greatly different amounts of overhang is reduced.

The amount of overhang is preferably 1.5 mm or less and, more preferably, 1 mm or less.

Because of a requirement of size reduction (thickness reduction) placed on the MCM, the chips embedded in the MCM tend to be thinner. If the thickness of the upper-level chip is 200 $\mu$m or less, the use of the present embodiment is particularly effective.

A description will be given to a method for fabricating the semiconductor device (assembly process) according to the present embodiment. FIGS. 14 to 17 are principle-portion cross sectional views illustrating the process of fabricating the semiconductor device according to the present embodiment.

Figure 14:
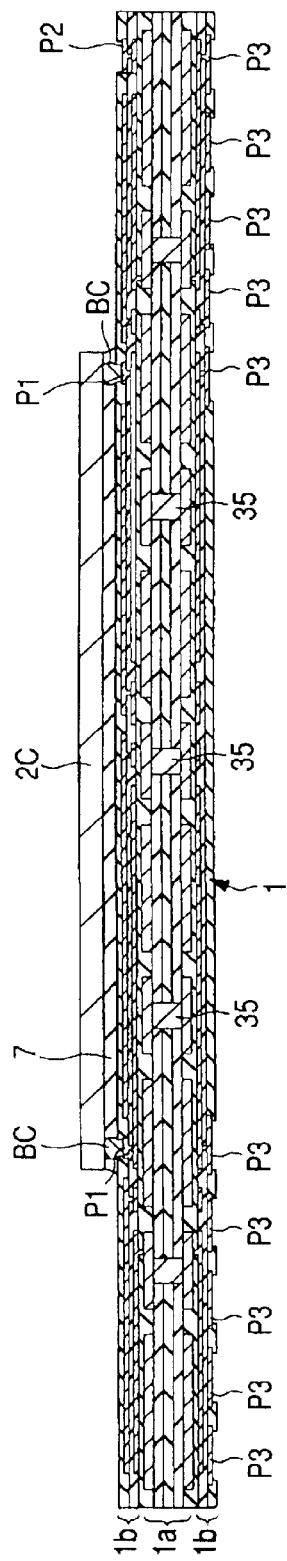
FIG. 14 is a cross-sectional view of the principal portion of a wiring substrate illustrating a method for fabricating a semiconductor chip according to an embodiment of the present invention.

As shown in FIG. 14, the microcomputer chip 2C is mounted on the wiring substrate 1 by a flip-chip method. Specifically, after the pads P1 on the upper surface of the wiring substrate 1 and the bump electrodes BC on the microcomputer chip are connected to each other, the underfill resin 7 is filled in the gap between the microcomputer chip 2C and the wiring substrate 1. The connection between the pads P1 and the bump electrodes BC on the microcomputer chip may also be implemented by a method of providing connection by melting solder bump electrodes, a method of providing connection by reflowing gold bump electrodes via a solder, or by a method of sandwiching a tape or paste composed of an anisotropic conductive resin or a non-conductive resin between the microcomputer chip 2C and the wiring substrate 1 and melting the tape or paste with the application of heat. In this case, the step of filling the underfill resin 7 is no more necessary.

Although FIG. 14 discloses only one wiring board, it is also possible to prepare a substrate consisting of a plurality of wiring substrates which are arranged continuously, mount the chips on each of the wiring substrates, and cut the substrate on a per device basis.

Figure 15:
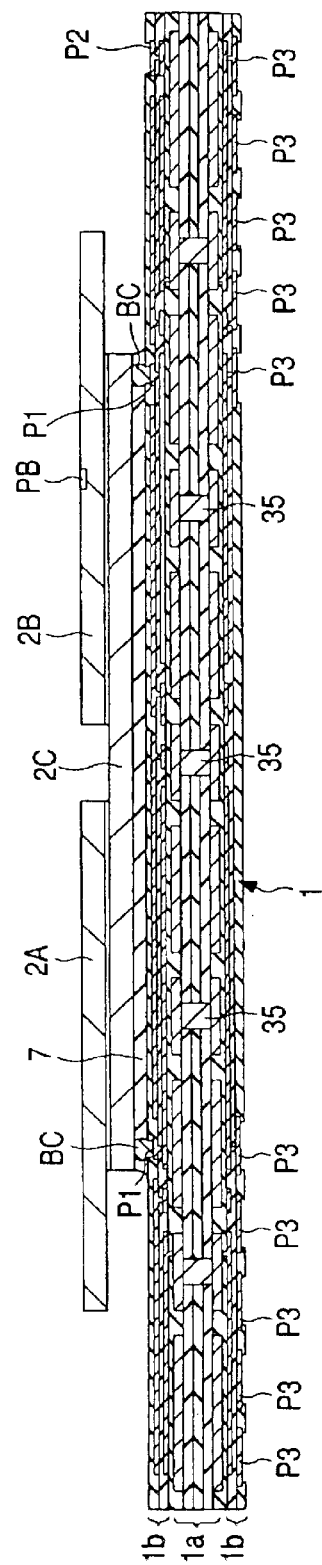
FIG. 15 is a cross-sectional view of the principal portion of the wiring substrate illustrating the method for fabricating a semiconductor chip according to the embodiment.
Figure 16:
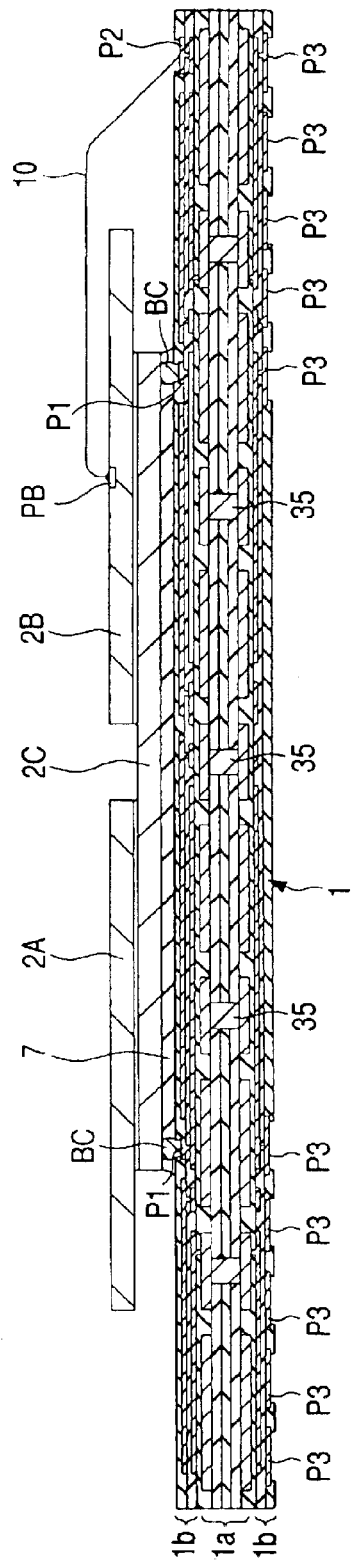
FIG. 16 is a cross-sectional view of the principal portion of the wiring substrate illustrating the method for fabricating a semiconductor chip according to the embodiment.

Next, as shown in FIG. 15, the memory chips 2A and 2B are fixed onto the microcomputer chip 2C by use of an adhesive or the like. Then, as shown in FIG. 16, the bonding pads PB and PA on the memory chips 2B and 2A and the bonding pads P2 on the wiring substrate 1 are connected to each other with the conductive wires 10 composed of gold wires or the like (see FIG. 2). The wire bonding is performed by use of, e.g., a wire bonder using ultrasonic vibration and thermal compression in combination.

Figure 17:
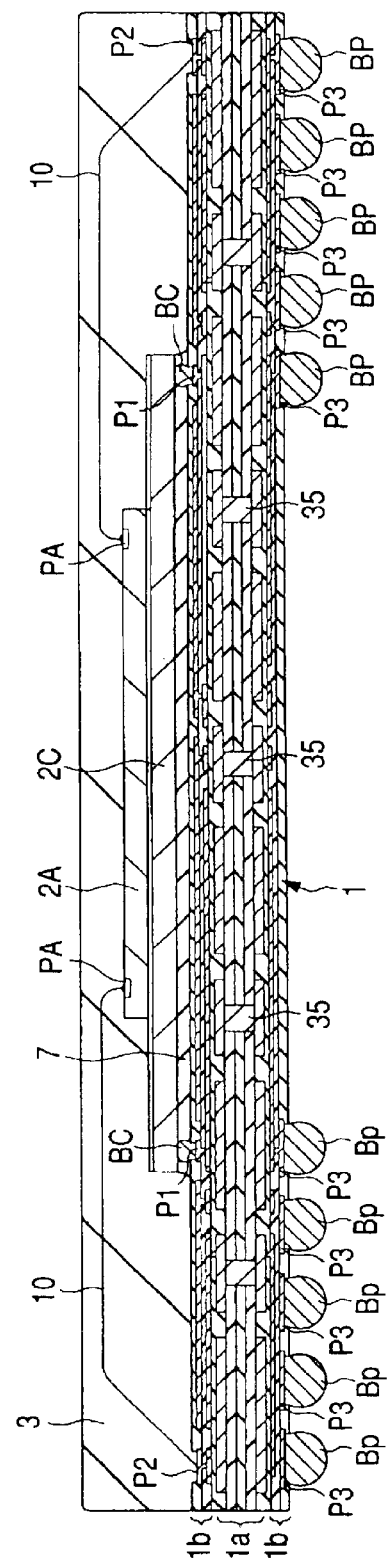
FIG. 17 is a cross-sectional view of the principal portion of the wiring substrate illustrating the method for fabricating a semiconductor chip according to the embodiment.

Next, as shown in FIG. 17, a wiring substrate 1 is attached to a mold die (not shown) and the entire principal surface thereof is encapsulated with the mold resin 3. The mold resin 3 is composed of, e.g., a thermosetting epoxy resin in which silica particles having diameters of about 70 $\mu$m to 100 $\mu$m are dispersed.

Thereafter, the bump electrodes Bp composed of a solder are connected onto the pads P3 on the back surface of the wiring substrate 1. If the plurality of wiring substrates 1 are coupled to each other, cutting is performed subsequently along dicing lines, thereby providing the individual distinct wiring boards 1. The bump electrodes Bp are formed by, e.g., supplying solder balls composed of a low-melting Pb—Sn eutectic alloy to the surfaces of the pads P3 and then reflowing the solder balls.

Although the invention achieved by the present inventors has been described specifically based on the foregoing embodiment, the present invention is not limited to the foregoing embodiment. It will easily be appreciated that various modifications can be made without departing from the gist of the invention.

Although the bonding pads PA or the bonding pads PB are formed in, e.g., one row according to the foregoing embodiment, they may also be formed in a plurality of rows. The bump electrodes BC may also be formed in a plurality of rows or area placement may also be performed instead.

Figure 18:
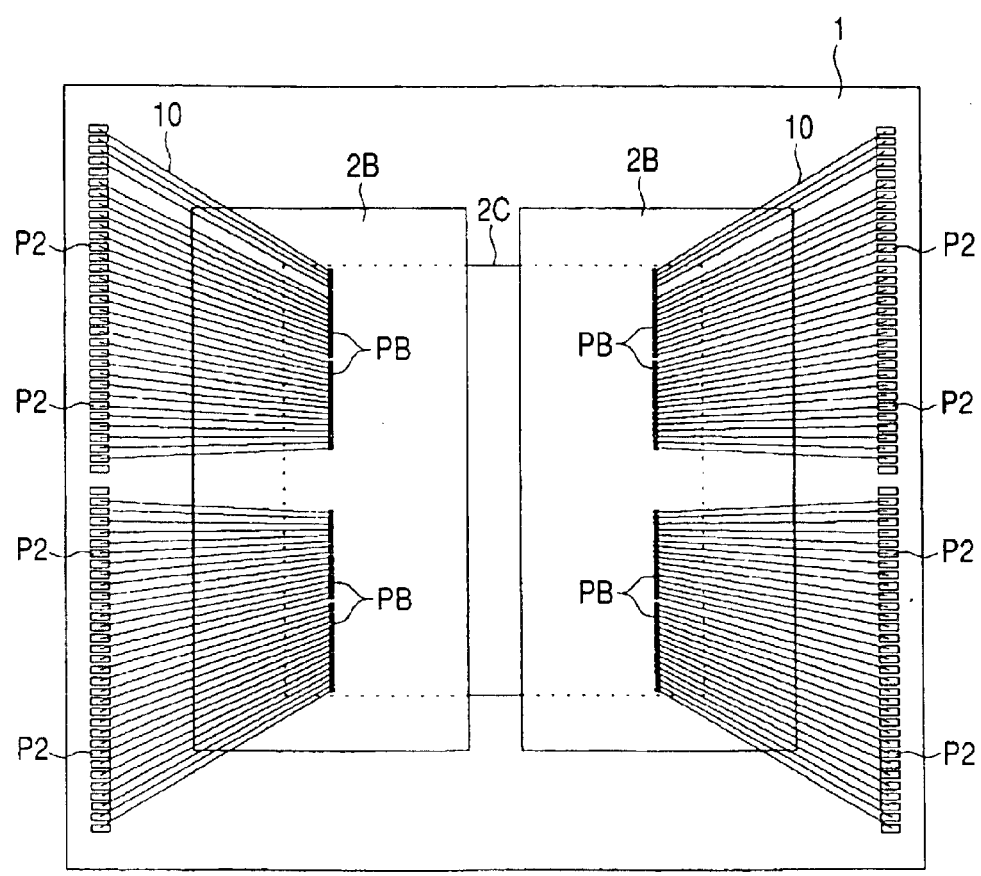
FIG. 18 is a plan view showing the upper surface of another semiconductor device according to the embodiment.

Although the foregoing embodiment has mounted the memory chip having the bonding pads at the center portion thereof (center chip) and the memory chip having the bonding pads at the both ends thereof (both side chip) over the microcomputer chip, it is also possible to mount two center chips, as shown in FIG. 18. Alternatively, two side chips may also be mounted.

Figure 19:
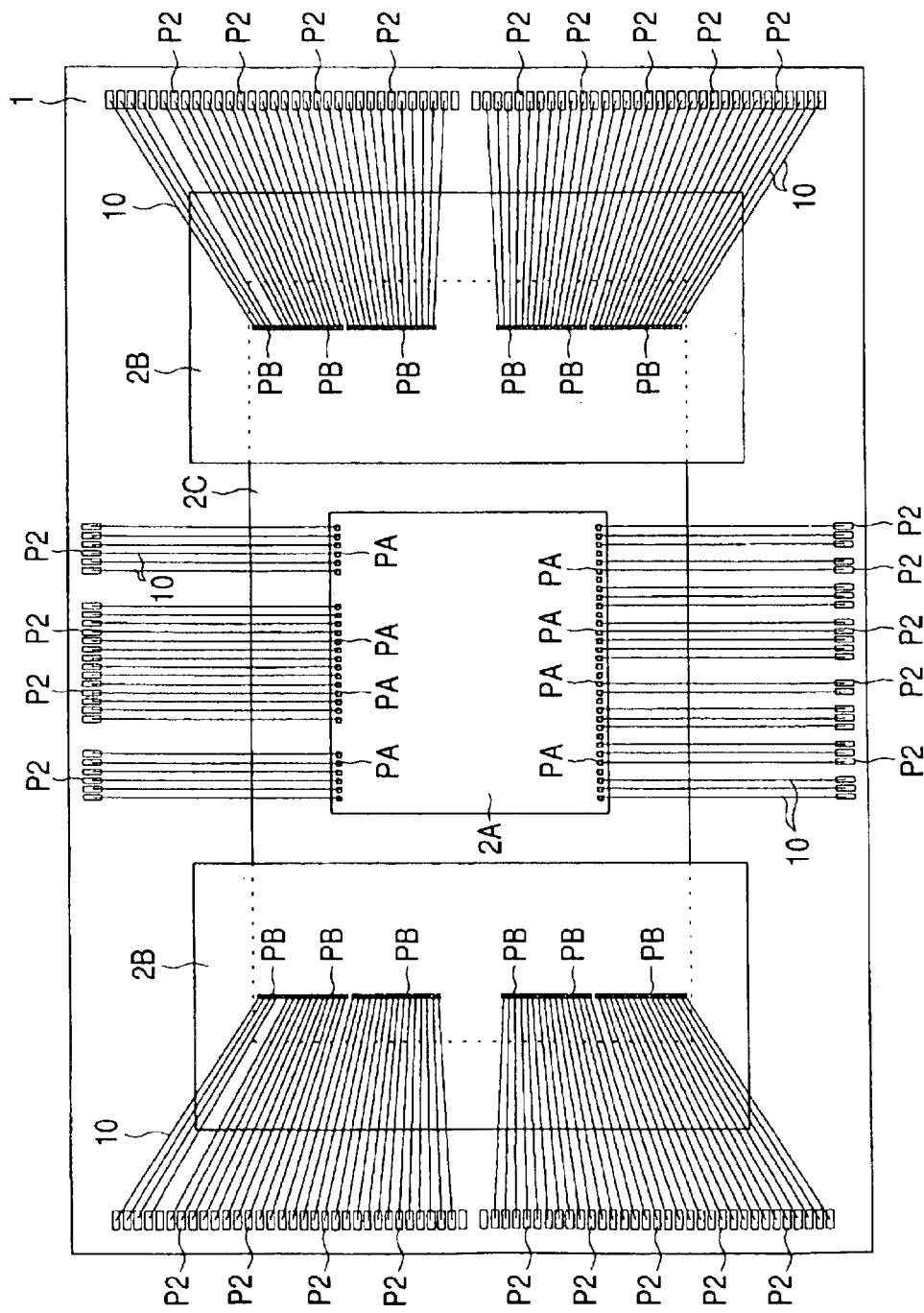
FIG. 19 is a plan view showing the upper surface of still another semiconductor device according to the embodiment.

Although the foregoing embodiment has mounted the two memory chips over the microcomputer chip, three chips may also be mounted as shown in FIG. 19.

Although the foregoing embodiment has shown the DRAM and the flash memory as examples of memory chips, other memory chips such as an SRAM may also be used.

The present invention is widely applicable to semiconductor devices in which chips different in the number of terminals are stacked in layers.

Besides the memory chips and the microcomputer chip, a small-size electronic component other than the chips, such as a capacitor or resistor element, may also be mounted on the wiring substrate. If chip capacitors are mounted along the outer periphery of the memory chip, e.g., a high-speed operation is achievable by reducing noise occurring during the driving of the memory chip.

The following is a brief description of the effects that can be achieved by the representative aspects of the invention disclosed in the present application.

When a microcomputer chip having a large number of terminals and memory chips each having a relatively small number of terminals are mounted in stacked relation on a wiring substrate, the microcomputer chip is disposed in a lower layer and the memory chips are disposed in an upper layer. This allows a reduction in the size of a semiconductor device or higher-density mounting. In addition, the reliability or functionality can be improved.

What is claimed is:

1. A semiconductor device comprising:
   (a) a wiring substrate having a first surface and a second surface opposing said first surface, first pads being formed over a first region of said first surface, while second pads being formed over a second region surrounding said first region;
   (b) a microcomputer chip having bump electrodes formed over a surface thereof, said microcomputer chip being mounted over said first region of said wiring substrate such that said first pads and said bump electrodes are electrically connected to each other; and
   (c) a memory chip having third pads formed over a surface thereof, said memory chip being mounted over a back surface of said microcomputer chip, said third pads being connected to said second pads by use of conductive wires.

2. A semiconductor device according to claim 1, wherein the number of said bump electrodes is larger than that of said third pads.

3. A semiconductor device according to claim 1, wherein said wiring substrate is a build-up substrate.

4. A semiconductor device according to claim 1, wherein a minimum pitch of said first pads or of said second pads is 65 $\mu$m or less.

5. A semiconductor device comprising:
   (a) a wiring substrate having a first surface and a second surface opposing said first surface, first pads being formed over a first region of said first surface, while second pads being formed over a second region surrounding said first region;
   (b) a microcomputer chip having bump electrodes formed over a surface thereof, said microcomputer chip being mounted over said first region of said wiring substrate such that said first pads and said bump electrodes are electrically connected to each other; and
   (c) first and second memory chips mounted over a back surface of said microcomputer chip,
   (c1) said first memory chip having third pads formed over a surface thereof,
   (c2) said second memory chip having fourth pads formed over a surface thereof,
   (c3) said third and second pads being connected to said second pads by use of conductive wires.

6. A semiconductor device according to claim 5, wherein the number of said bump electrodes is larger than a sum of the respective numbers of said third and fourth pads.

7. A semiconductor device according to claim 5, wherein said wiring substrate is a build-up substrate.

8. A semiconductor device according to claim 5, wherein a shortest pitch of said first pads or of said second pads is 65 $\mu$m or less.

9. A semiconductor device according to claim 5, wherein each of said first and second memory chips is controlled by said microcomputer chip.

10. A semiconductor device according to claim 5, wherein
    (d) wherein a width of said microcomputer chip in a first direction is smaller than a sum of respective widths of said first and second memory chips in said first direction,
    wherein said microcomputer chip has a pair of edges extending in a second direction orthogonal to said first direction,
    wherein said first memory chip protrudes outwardly from one of said pair of edges, and
    wherein said second memory chip protrudes outwardly from the other of said pair of edges.

11. A semiconductor device according to claim 5, wherein each of said first and second memory chips protrudes by a distance of 1.5 mm or less from the corresponding one of said pair of edges of the microcomputer chip.

12. A semiconductor device according to claim 5, wherein each of said first and second memory chips protrudes by a distance of 1 mm or less from the corresponding one of said pair of edges of edges of the microcomputer chip.

13. A semiconductor device according to claim 5, wherein each of said first and second memory chips is thinner than said microcomputer chip.

14. A semiconductor device according to claim 5, wherein each of said first and second memory chips has a thickness of 200 $\mu$m or less.

15. A semiconductor device according to claim 5, wherein a resin is filled in a space under a portion of each of said first and second memory chips protruding from said pair of edges of said microcomputer chip.

16. A semiconductor device according to claim 5, wherein each of said first and second memory chips is a DRAM or a nonvolatile memory.

17. A semiconductor device according to claim 5, wherein said third and fourth pads are arranged in linear configurations at respective center portions of the memory chips or arranged in linear configurations along respective two opposing edges of the memory chips.

18. A semiconductor device according to claim 17, wherein said first and second chips have said third and fourth pads arranged along edges of said microcomputer chip and connected to said second pads by use of said conductive wires such that they do not extend over the other memory chip.

19. A semiconductor device according to claim 5, wherein said third pads are connected to said second pads by use of said conductive wires such that do not extend over said second memory chip and said fourth pads are connected to said second pads by use of said conductive wires such that they do not extend over said first memory chip.

20. A semiconductor device comprising:
(a) a wiring substrate having a first surface and a second surface opposing said first surface, first pads being formed over a first region of said first surface, while second pads being formed over a second region surrounding said first region;

(b) a microcomputer chip having bump electrodes formed over a surface thereof, said microcomputer chip being mounted over said first region of said wiring substrate such that said first pads and said bump electrodes are electrically connected to each other; and (c) a plurality of memory chips mounted over a back surface of said microcomputer chip, each of the memory chips having third pads formed over a surface thereof, said third pads being connected to said second pads by use of conductive wires.

* * * * *